(12) United States Patent
Diggin et al.

(10) Patent No.: US 6,580,961 B2
(45) Date of Patent: Jun. 17, 2003

(54) CIRCUIT PRODUCTION METHOD

(75) Inventors: William Diggin, Greystones (IE); Kevin Keane, Dublin (IE); James Mahon, Dublin (IE); Joseph O'Keeffe, County Dublin (IE); John Milroy, Dublin (IE)

(73) Assignee: MV Research Limited, Dublin (IE)

( * ) Notice: Subject to any disclaimer, the term of this patent is extended or adjusted under 35 U.S.C. 154(b) by 0 days.

(21) Appl. No.: 10/040,477

(22) Filed: Jan. 9, 2002

(65) Prior Publication Data

US 2002/0099466 A1 Jul. 25, 2002

Related U.S. Application Data

(63) Continuation of application No. PCT/IE00/00089, filed on Jul. 13, 2000.

(30) Foreign Application Priority Data

Jul. 13, 1999 (IE) ............................................. S990589

(51) Int. Cl.[7] ........................ G06F 19/00; G05B 19/418
(52) U.S. Cl. ........................ 700/121; 700/45; 700/108; 29/740
(58) Field of Search .......................... 700/121, 44, 45, 700/95, 108–110, 117, 56–62; 702/35, 84; 709/203; 29/832–834, 840, 711, 712, 701, 740; 438/14

(56) References Cited

U.S. PATENT DOCUMENTS

| | | | | |
|---|---|---|---|---|
| 4,919,074 A | | 4/1990 | Kurihara et al. | 118/697 |
| 5,249,356 A | * | 10/1993 | Okuda et al. | 29/833 |
| 5,329,690 A | * | 7/1994 | Tsuji et al. | 29/701 |
| 5,564,183 A | * | 10/1996 | Satou et al. | 29/840 |
| 5,566,447 A | * | 10/1996 | Sakurai | 29/832 |
| 5,757,673 A | | 5/1998 | Osheiski et al. | 364/552 |
| 5,859,964 A | | 1/1999 | Wang et al. | 395/185 |
| 5,993,043 A | * | 11/1999 | Fujii | 700/121 |
| 6,445,969 B1 | * | 9/2002 | Kenney et al. | 700/108 |

FOREIGN PATENT DOCUMENTS

| | | |
|---|---|---|
| EP | 0448702 B1 | 8/1995 |
| WO | WO85/04521 | 10/1985 |
| WO | WO98/18066 | 4/1998 |
| WO | WO99/25169 | 5/1999 |

* cited by examiner

*Primary Examiner*—Leo Picard
*Assistant Examiner*—Steven R. Garland
(74) *Attorney, Agent, or Firm*—Jacobson Holman PLLC

(57) ABSTRACT

A closed loop controller (6) has a measurement server (11) which captures measurement data from a measurement machine (3) via a link (22). It also receives production data indicating which placement machine parts were involved in depositing inspected items, via links (20, 21). The server (11) correlates this data and transmits it via a link (23) to a closed loop client (10), which generates process engineer displays of the correlated data and generates a control signal for the placement machine (2). These are fed back via a link (24) for automatic closed loop control.

30 Claims, 3 Drawing Sheets

CIRCUIT PRODUCTION METHOD

This is a continuation of PCT/IE00/00089 filed Jul. 13, 2000 and published in English.

FIELD OF THE INVENTION

The invention relates to production of circuits in which items such as glue deposits, solder deposits, and electronic components are deposited on a substrate such as a printed circuit board.

PRIOR ART DISCUSSION

Heretofore, there have been many developments in the field of screen printing, component dispensing, and component placement to achieve excellent tolerances and efficiencies in circuit production machines. Yield is maintained by manual adjustment of machine parameters according to visual inspections and inspection machine circuit quality outputs. There is considerable room for error in this approach, and accordingly yields are often not as high as desired.

The invention is therefore directed towards providing a circuit production method having improved yields.

Another object is to achieve the above with little modification of existing production equipment.

SUMMARY OF THE INVENTION

According to the invention, there is provided a method of producing a circuit in which a production machine deposits an item onto a substrate and a measurement machine inspects the quality, characterised in that the method comprises the further steps of:
  a closed loop controller capturing measurement data from said measurement machine;
  the closed loop controller using said measurement data to generate a control signal for the production machine; and
  the production machine using said control signal for improved process control.

In one embodiment, the closed loop controller uses configuration rules associated with the production machine to generate the control signal.

In one embodiment, the closed loop controller also uses production data indicating which parts of the production machine were involved in depositing items, to generate the control signal.

In one embodiment, the closed loop controller uses an identifier of a substrate to generate the control signal.

In one embodiment, the production data is static, in which the production machine part which deposits each item does not change during a production run.

In another embodiment, the production machine is a component placement machine and said placement machine does not use a different nozzle to make a subsequent placement after a component has been mis-picked.

In one embodiment, the dosed loop controller dynamically receives feed-forward production data from the production machine in real time.

In one embodiment, the production data associates parts of the production machine with deposited items.

In a further embodiment, the production machine is a component placement machine and said production data associates parts at machine, beam, turret, head, nozzle, and feeder levels with deposited components.

In one embodiment, the closed loop controller dynamically generates an output to convey the measurement data to a process engineer.

In one embodiment, said output comprises accuracy charts graphically illustrating accuracy of a deposited item.

In one embodiment, the closed loop controller starts feeding back the control data after generating said output and receiving an instruction from a process engineer.

In one embodiment, both the production machine and the measurement machine automatically detect a substrate identifier, and the measurement machine incorporates said identifier in the measurement data, for correlating the production data with the measurement data.

In one embodiment, the substrate identifier is a bar code and the production machine and the measurement machine read said bar code.

In one embodiment, the closed loop controller comprises a measurement server and a closed loop client, the measurement server captures data from the measurement machine, and the closed loop client generates the control signal and feeds it back to the production machine.

In one embodiment, there is one measurement server associated with each measurement machine.

In another embodiment, there is one closed loop client associated with each production machine.

In one embodiment, the measurement server uses said measurement data and said production data to generate correlated data, and feeds the correlated data to the closed loop client.

In one embodiment, the closed loop client uses the correlated data to generate the control signal according to configuration rules associated with the associated production machine.

In one embodiment, the closed loop client generates the process engineer output according to correlated data received from the measurement server.

In one embodiment, the measurement server comprises a data processing server, the closed loop client comprises a data processing client, and the client and the server communicate with each other using the client/server architecture.

In one embodiment, the configuration rules define conditions to trigger transmission of a control signal.

In one embodiment, a condition is that an offset outside a tolerance occurs greater than a pre-set number of times.

In one embodiment, a condition is that an offset outside a high threshold occurs once.

In one embodiment, the closed loop controller includes a production machine shut-down instruction in the control signal when an alarm condition is met.

According to another aspect, the invention provides a closed loop controller comprising:
  means for automatically capturing measurement data from a measurement machine for inspecting a circuit having deposited items; and
  means for using said measurement data to generate a control signal for a production machine, and for feeding said control signal back to the production machine.

In one embodiment, the closed loop controller comprises:
  a measurement server comprising means for capturing said measurement data and for correlating the measurement data with production data indicating which parts of the production machine were involved in depositing items, and for feeding back correlated data, and
  a closed loop client comprising means for receiving the fed back correlated data and for using said correlated data to generate the control signal according to configuration rules.

In one embodiment, the closed loop controller comprises means for generating a process engineer output incorporating said measurement data.

In one embodiment, the closed loop client comprises means for generating said output using the correlated data.

In one embodiment, the closed loop client comprises means for initiating feedback of a control signal upon receipt of a user instruction.

In one embodiment, the closed loop controller comprises means for dynamically receiving feed-forward production data from the production machine.

In one embodiment, the measurement server comprises a data processing server, the closed loop client comprises a data processing client, and the client and the server comprise means for communicating with each other using the client/server architecture.

In one embodiment, the measurement server has a class structure with a method for production data acquisition, and a method for measurement data acquisition.

In one embodiment, the measurement server has a method for raising a defect alarm event.

In one embodiment, the closed loop client has a class structure with a method for each of production data acquisition, correlated data acquisition, and transmission of a control signal.

In one embodiment, the closed loop client has a method for production machine shut down.

BRIEF DESCRIPTION OF THE DRAWINGS

The invention will be more clearly understood from the following description of some embodiments thereof given by way of example only with reference to the accompanying drawings in which.

DESCRIPTION OF THE EMBODIMENTS

Figure 1:
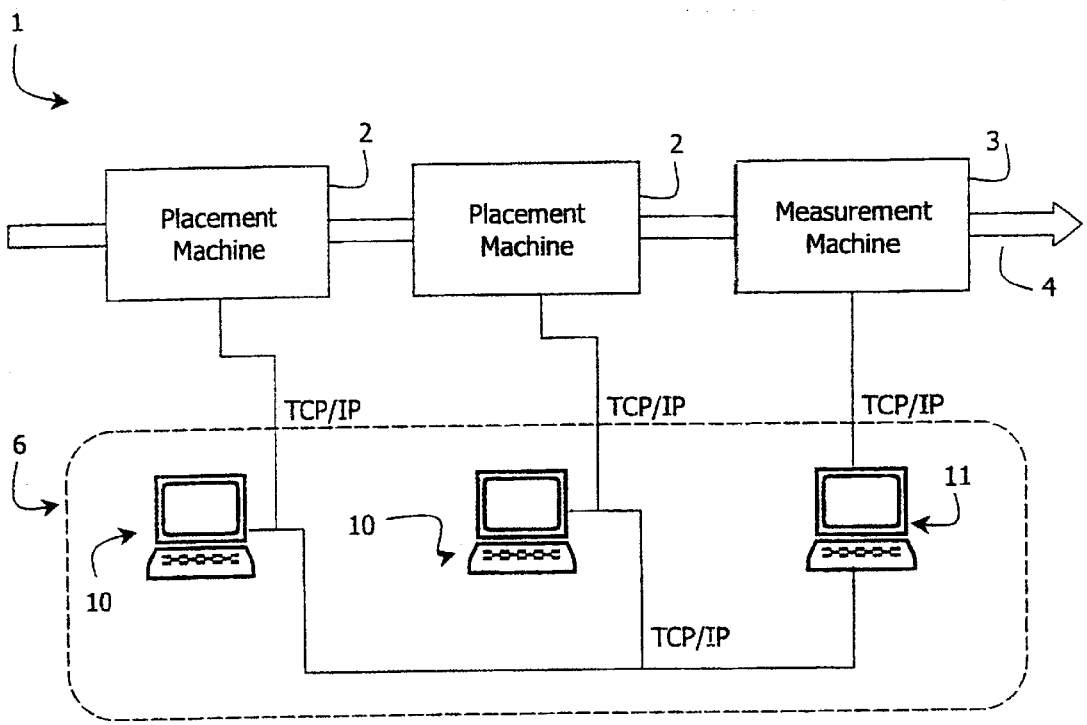
FIG. 1 is a diagram of a production system of the invention.

Referring to FIG. 1, an SMT production system 1 comprises two placement machines 2 followed by a measurement machine 3, all at a PCB conveyor 4. The placement machines 2 may be of any presently available type, and the measurement machine 3 is of the type marketed by MV Technology Ltd under the name SJ-10™. This machine determines quality by both recognising the placed components and measuring their placement accuracy.

The system 1 also comprises a closed loop controller 6 comprising an automatic closed loop (ACL) client 10 associated with each placement machine 2 and a measurement server computer 11 associated with the measurement machine 3. All communication links are over TCP/IP.

Figure 2:
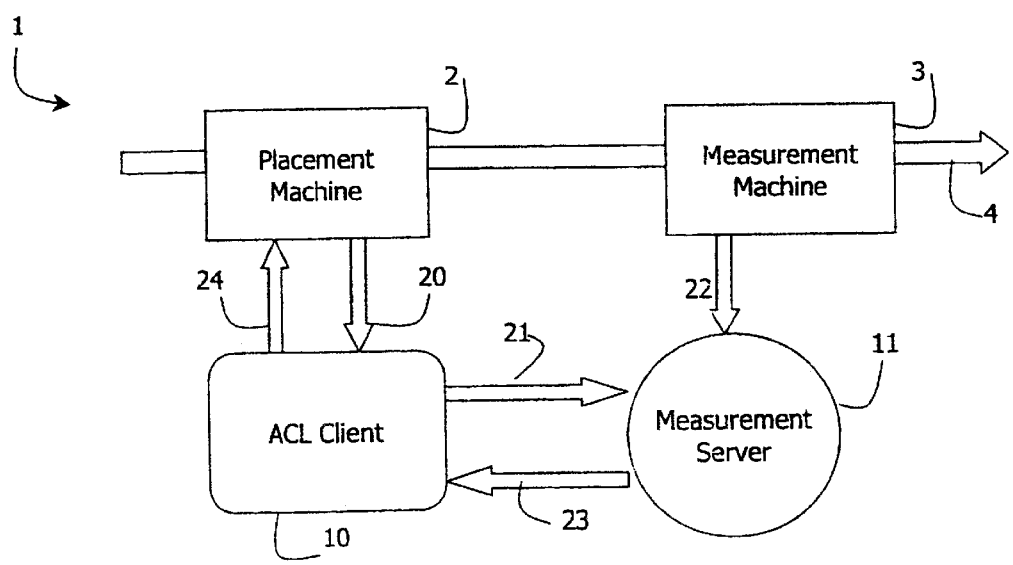
FIG. 2 is a diagram showing the signal flows in the system.

The logical structure and signal flows are shown in FIG. 2. Links 20 and 21 provide the measurement server 11 with feed-forward production data indicating a production history for a board inspected by the measurement machine 3. A link 22 provides measurement data. It captures and stores measurement data and production data, it associates the measurement data with the production data on the basis of a board identifier and, when requested, sends the resultant correlated data on a feedback link 23 to the ACL client 10. The ACL client 10 uses configuration rules to convert the correlated data to a control signal having a protocol and a level of intelligence set according to the requirements and nature of the placement machine 2. The control signal may simply comprise the same data as the correlated data (only protocol-converted), or it may include high-level control instructions for the placement machine 2. The nature of the control signal depends on the requirements set out by the placement machine vendor. It is transmitted to the placement machine 2 on a feedback link 24.

Thus, the closed loop controller 6 automatically provides closed loop control of placement so that errors are very quickly rectified and yield is therefore improved.

In addition to generation and transmission of the control signal, each ACL client 10 also displays a process engineer output indicating the correlated data for the associated placement machine 2. Thus, the process engineer is inherently involved in the process control as he or she can visualise the effects of the closed loop control and is thereby given reassurance that all is in order. Although the correlated data used for the display is generated and stored by the measurement server 11 it is displayed by the relevant ACL client 10 so that it is physically close to the relevant placement machine 2.

The architecture is a client/server arrangement between the ACL client 10 and the measurement server 11. Typically, there is one measurement machine 3 and one measurement server per production line, and the measurement server 11 is an effective node for linking with general production control systems of a factory having multiple production lines.

Each board is identified by a bar code which is read by both the placement machines 2 and by the measurement machine 3. The measurement machine 3 incorporates the board identifier in the measurement data forwarded to the measurement server 11 on the link 22. The board identifier is also incorporated in the production data, forwarded to the measurement server 11 on the feed forward links 20 and 21. The server 11 correlates the measurement data and the production data using the board identifier.

The production data may be "static", i.e. pre-stored in the measurement server 11 and not changing during production because it is always the same placement machine part which is used for each particular placed component. This may be the case, for example, where even if a nozzle mis-picks, the machine 2 does not use a different nozzle to make a subsequent placement. In this "static" situation there is no need for the feed-forward links 20 and 21. Another example of a "static" situation is where the deposited items are not electronic components, but instead are screen-printed glue dots or solder pads. In these cases the same machine part, namely a screen-printing screen, is used for the full production run.

The production data may alternatively be dynamic. A typical example is the component placement machines 2. These have a hierarchical part arrangement from top down comprising:

| Picking | Placement |
|---|---|
| placement machine, | placement machine, |
| feeder, and | beam, |
| feeder part number. | turret, |
| | head, and |
| | nozzle. |

While a particular set of parts from this hierarchy is pre-programmed to be involved in placement of each component, this dynamically changes due to factors such as:

mis-picking of a component and subsequent pick-and-place by a different nozzle, and feeders running out of components.

In more detail, the following is an example of a set of measurement data.

<Measurement data>
rd: slg4066b, Operator: developer, 09-Jun-2000 12:04:35, BC: bc1234567

| RefDes | Type | Pres | Angle | X | Y | Theta | ErrCode |
|---|---|---|---|---|---|---|---|
| 4:c950 | cjack6 | 59 | 0 | −12 | 133 | 0 | 0 |
| 4:c909 | cjack6 | 53 | 18 | 16 | 93 | 0 | 0 |
| 4:c910 | cjack6 | 54 | 18 | −27 | 89 | −5 | 0 |
| 4:r927 | rjack5 | 52 | 27 | 22 | −140 | 21 | 0 |
| 4:c937 | btantby | 255 | 27 | 5 | −140 | 5 | 0 |
| 4:u901 | sjack6 | 152 | 27 | 5 | −14 | −1 | 0 |
| 4:r926 | rjack4 | 57 | 0 | −95 | 118 | −4 | 0 |
| 4:r939 | rjack5 | 51 | 9 | 107 | −101 | −21 | 0 |
| 4:c906 | btantby | 255 | 9 | −116 | 115 | 0 | 0 |
| 4:c905 | btantby | 255 | 9 | −97 | 24 | 3 | 0 |
| 4:cr950 | tjack | 157 | 27 | −111 | 61 | −11 | 0 |
| 4:q960 | qjack | 73 | 18 | −6 | 140 | 0 | 0 |

As set out above, the measurement data includes:

a board ID derived from the bar code, an operator ID, a component ID, "RefDes", a vision algorithm identifier "Type" for the measurement machine 3, a presence score "Pres" for the component inspected, the score being on a scale and having a threshold associated with the particular component, component orientation design value "Angle" and actual measured orientation offset from the design value "Theta", X offset (in microns), Y offset (in microns), Error code bitmask "ErrCode" indicating defects, e.g. "1" means component missing, "2" means offset outside tolerance. The bitmask may also include a text description of the error.

The following is an example of the production data for the two placement machines.

<Production data for machine 1>
Board: slg4066b, 09-Jun-2000 12:01:21, BC: bc1234567

| RefDes | Mc | Head | Nozzle | Feeder |
|---|---|---|---|---|
| p 4:c950 | 1 | 1 | 3 | 1 |
| p 4:c909 | 1 | 2 | 4 | 3 |
| p 4:c937 | 1 | 2 | 3 | 2 |
| p 4:u901 | 1 | 4 | 5 | 10 |
| p 4:r926 | 1 | 2 | 3 | 130 |
| p 4:c905 | 1 | 3 | 6 | 131 |
| p 4:cr950 | 1 | 3 | 4 | 120 |
| p 4:q960 | 1 | 1 | 2 | 11 |

<Production data for machine 2>
Board slg4066b, 09-Jun-2000 12:02:21, BC: bc1234567

| RefDes | Mc | Head | Nozzle | Feeder |
|---|---|---|---|---|
| p 4:c910 | 2 | 1 | 4 | 3 |
| p 4:r927 | 2 | 1 | 3 | 10 |
| p 4:r939 | 2 | 2 | 1 | 11 |
| p 4:c906 | 2 | 2 | 1 | 27 |

As is clear for the above, the production data provides a dynamic indication of which machine, head, and nozzle was used for placement of each component, and which feeder was used for picking.

Figure 3:
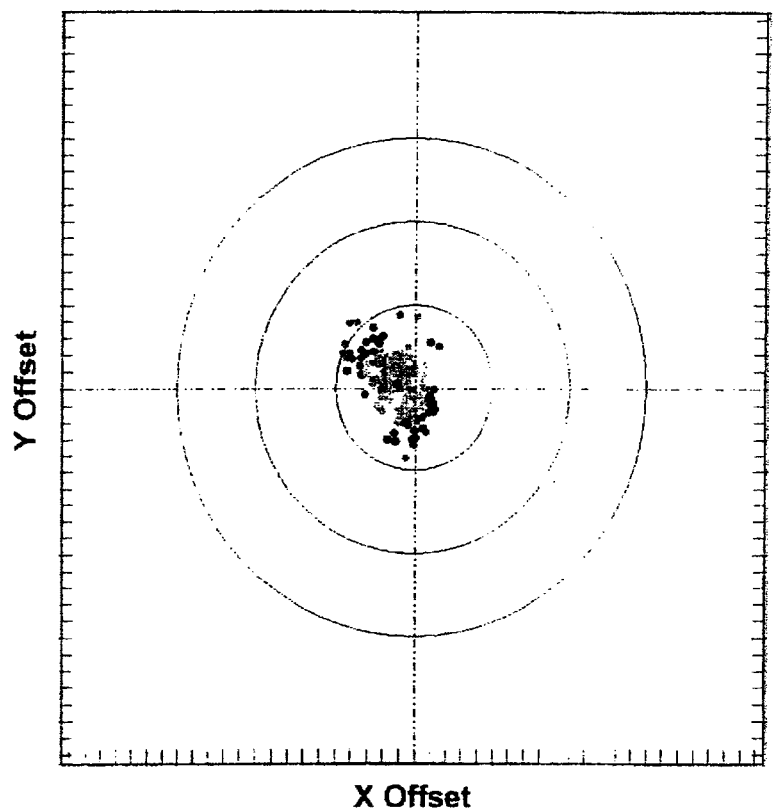
FIGS. 3 and 4 are sample graphical outputs.

The server 11 correlates the measurement data and the production data to provide correlated data on the link 23 of FIG. 2. This is used by the relevant ACL client 10 to generate displays for the process engineer. Referring to FIG. 3, a "scatter" chart (also referred to as a "Bullseye" or an "XY Offset" chart) displays the X and Y offsets for components placed on a PCB. Each point on the chart (with the exception of the centralised Black Point which represents the Mean of the offsets) represents the X and Y offset for an individual component. Scatter charts can be plotted for any choice of machine part, for example, machine, turret, head, nozzle, and the points correspond to the components placed by the machine part. The dispersal of points indicates the scatter in placements by a machine entity for a particular PCB.

Figure 4:
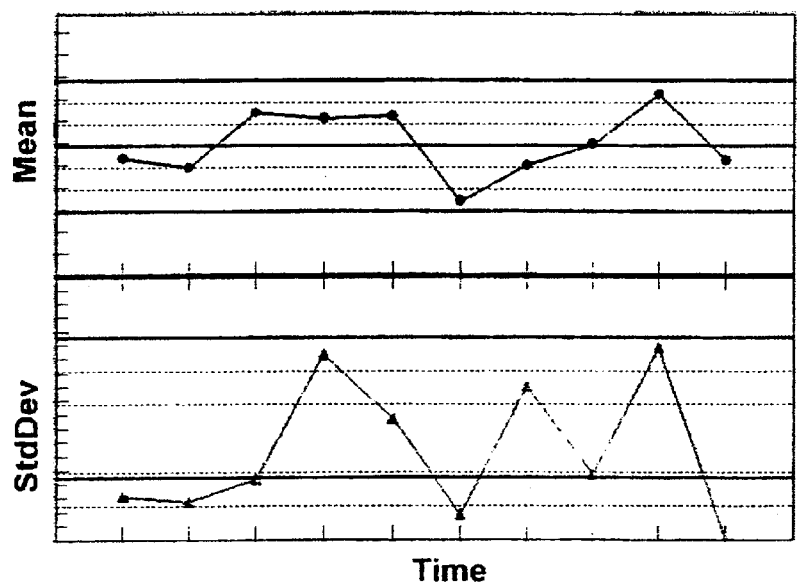

Referring to FIG. 4, an Xs Control Chart (also referred to as a "Mean and Standard Deviation" or "Trend" chart) displays the mean and standard deviation of the offsets for components placed on a PCB. In contrast to the Scatter Chart (which shows the offsets for a group of components on one PCB), the Xs Control Chart shows a series of points corresponding to a series of PCBs. The series of mean values is placed above the series of standard deviation values and vertically aligned pairs of mean and standard deviation points correspond to the same PCB. Xs Control Charts can be plotted for any choice of machine part, e.g., machine, turret, head, nozzle. Trends in the mean and standard deviation of placements offsets for a machine part are indicated in the Xs Control Chart.

These displays provide very clear and comprehensive information for the process engineer so that he or she can monitor effectiveness of use of the control signal fed to the placement machines 2. The display is physically beside the relevant placement machine and so is particularly convenient. Also, the ACL client 10 user interface allows the process engineer to have over-riding control over transmission of the control signal on the link 24.

As stated above, the control signal is of a type set by configuration rules in the ACL client 10 according to the placement machine vendor. These rules include conditions to trigger transmission of a control signal. Examples of conditions which will trigger the control signal are as follows.

Mean X Offset is >50 microns.

Mean Y Offset is >50 microns.

Mean X Offset is >10*Standard Deviation X Offset.

Mean Y Offset is >10*Standard Deviation Y Offset.

7 Consecutive Increases in Mean X Offset>5 microns.

7 Consecutive Decreases in Mean X Offset<−5 microns.

Every N boards, i.e. average over the last N boards.

These conditions can apply to any machine part.

The ACL clients 10 can limit the magnitude of the corrections that may be fed back to the placement machine 2. It is also possible to use alarm functionality of the measurement server 11 to generate alarms and shut down a placement machine 2 via the ACL client 10 on the links 23 and 24. Examples of these criteria include:

Magnitude of the correction is greater than a pre-defined threshold

Greater than N defects detected on a board

Greater than N defects detected in H hours

Greater than N consecutive defective boards

The ACL clients 10 comprises means for interfacing with a variety of different production machines using TCP/IP. They use Remote Procedure Calls (RPC) to execute procedures on their corresponding placement machines 2.

Figure 5:
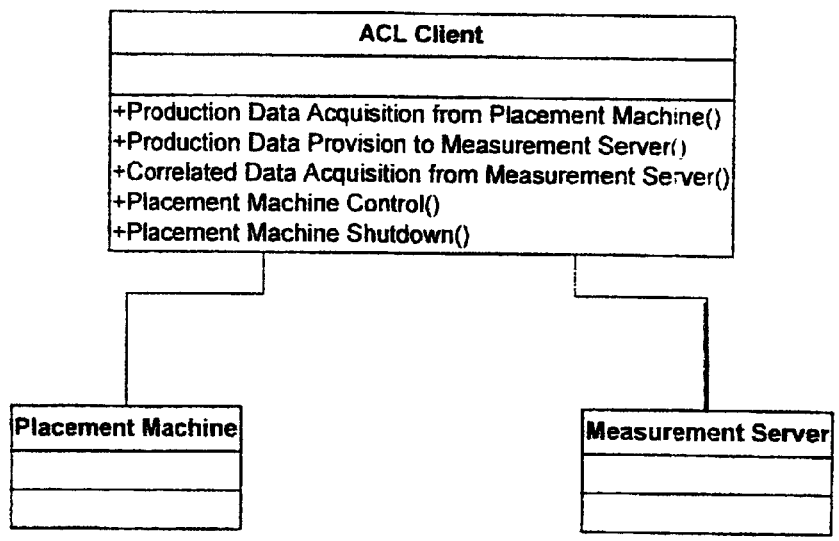
FIG. 5 is a class diagram of a process control client.

The following describes the ACL client 10 methods in greater detail, with reference to FIG. 5.

ACL: Production Data Acquisition from Placement Machine

After placing a board, the placement machine 2 raises a New Placement Event for production data on the link 20. The ACL Client 10 understands the format of this data. A more general format for the production data than that given in the table above, using the XML protocol is as follows:

```
<Machine> M=MachineX B=barcodeX
    <RefDes> R=RefDesX   H=HeadX  T=TurretX  N=NozzleX
    F=FeederX</RefDes>
    <RefDes> R=RefDesY   H=HeadY  T=TurretY  N=NozzleY
    F=FeederY</RefDes>
    . . . and so on for all the RefDes placed by MachineX
</Machine>
```

In using XML, the machine attribute list for RefDes placement is easy to extend. The protocol for raising the New Placement Event and providing dynamic placement data for the ACL client 10 is agreed between the placement machine manufacturers and the suppliers of the closed loop controller 6. XML is particularly effective for communicating hierarchical machine part data.

ACL: Production Data Precision to Measurement Server

The ACL client 10 parses the production data and renders this data in a form suitable for the measurement server 11 to insert into a database. The data is then forwarded to the measurement server 11 on the link 21.

ACL: Correlated Data Acquisition from Measurement Server

The ACL Client gathers dynamic correlated data from the measurement server on the link 23 when certain criteria are met, such as the conditions set out above.

ACL: Placement Machine Control:

After acquiring the dynamic correlated data, the ACL client 10 adjusts the data to accommodate any differences across the coordinate systems of the placement machine 2 and the measurement machine 3. The ACL client 10 then raises a New Control Measurement Event with a control signal on the link 24 which is captured by the placement machine 2. The placement machine 2 understands the format of the control signal. The following is an XML example:

```
<Machine> M=MachineX
    <Turret> T=TurretX xm=MeanX ym=MeanY sm=MeanSkew xs=SigmaX
    ys=SigmaY ss=SigmaSkew
        <Head> H=HeadX xm=MeanX ym=MeanY sm=MeanSkew xs=SigmaX
        ys=SigmaY ss=SigmaSkew
            <Nozzle> N=NozzleX xm=MeanX ym=MeanY sm=MeanSkew
            xs=SigmaX ys=SigmaY ss=SigmaSkew</Nozzle>
            <Nozzle> N=NozzleY xm=MeanX ym=MeanY sm=MeanSkew
            xs=SigmaX ys=SigmaY ss=SigmaSkew</Nozzle>
            . . . and so on for all the Nozzles of HeadX
        </Head>
        . . . and so on for all the Heads of TurretX
    </Turret>
    . . . and so on for all the Turrets of MachineX
    <Feeder> F=TurretX xm=MeanX ym=MeanY sm=MeanSkew xs=SigmaX
    ys=SigmaY ss=SigmaSkew</Feeder>
    . . . and so on for all the Feeders of MachineX
</Machine>
```

The protocol for raising the New Control Event and providing measurement data for the placement machine is pre-set.

ACL: Placement Machine Shutdown

The ACL client 10 receives an alarm from the measurement server 11 when certain criteria are met such as shut down conditions described above. This is passed to the placement machine 2 for shutdown.

Figure 6:
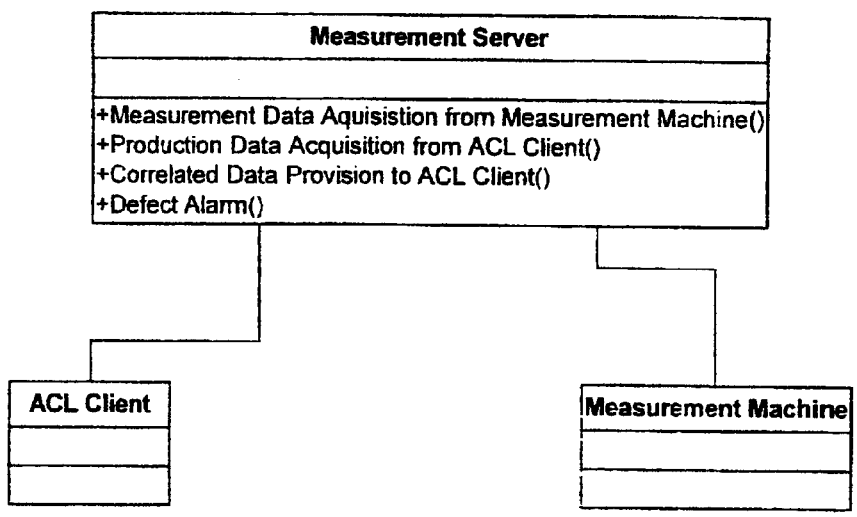
FIG. 6 is a class diagram for a measurement server.

The following describes the measurement server methods in greater detail with reference of FIG. 6.

MS: Measurement Data Acquisition from Measurement Machine

The measurement server 11 gathers static measurement data from the measurement machine 3. The measurement data is inserted and stored in a database.

MS: Measurement Data Acquisition from Measurement Machine

The measurement server 11 gathers production data from ACL clients 10. The measurement server then correlates the production data with the measurement data. The database is updated with correlated data.

MS: Correlated Data Provision to ACL Clients

The measurement server 11 makes the correlated data available to ACL clients 10 when certain criteria are met. Hence the measurement server 11 needs to perform criteria tests after data correlation. For example, suppose an ACL client 10 requests correlated data when the mean machine X offset is greater than 50 microns. The measurement server 11 queries its database after updating the database with correlated data to check if any machine X offset is greater than 50 microns. If this criterion is satisfied the measurement server 11 raises a Criterion Satisfied Event with the machine X offset, which will be caught by the ACL clients 10.

MS: Defect Alarm

The measurement server 11 will raise a Defect Alarm Event, which will be captured by ACL clients 10 if certain defect criteria met. For example, suppose an ACL client 10 requests a defect alarm if there are any defects on a board, the measurement server 11 queries its database after updating it with measurement data. If a defect is detected the measurement server raises a Defect Alarm Event.

It will be appreciated that the invention provides for automatic corrective action. The parts of the closed loop controller 6 are at all times synchronised with the associated production and measurement machines and the control signal is activated when required in real time. This is achieved in a safe and controlled manner. One reason is that the measurement server 11 has the benefit of both measurement data and also production data and so it can generate correlated data. Another reason is that the process engineer can visually monitor quality and see the effects of corrective action taken and activate the control signal or de-activate it as appropriate. The system may be easily installed because of the modular client/server architecture and data processing relationships.

The invention is not limited to the embodiments described but may be varied in construction and detail. For example, the production machine may be of any other type, such as a glue dispenser or a solder screen printer, which deposits items on a substrate. The ACL client user interface allow use or the closed loop controller for particular production runs or for automatic calibration at frequent time periods using a "master board".

We claim:

1. A method of producing a circuit in which a placement machine deposits components onto a substrate and a measurement machine inspects for quality, the method comprising the further steps of:

a closed loop controller capturing measurement data from said measurement machine;

the closed loop controller dynamically receiving feed-forward production data from the placement machine in real time, said production data associating parts of the placement machine with deposited components;

the closed loop controller using said measurement data and said production data to generate a control signal for the placement machine; and the placement machine using said control signal for improved process control.

2. The method as claimed in claim 1, wherein the closed loop controller uses configuration rules associated with the placement machine to generate the control signal.

3. The method as claimed in claim 2, wherein the configuration rules define conditions to trigger transmission of a control signal.

4. The method as claimed in claim 3, wherein a condition is that an offset outside a tolerance occurs greater than a pre-set number of times.

5. The method as claimed in claim 3, wherein a condition is that an offset outside a high threshold occurs once.

6. The method as claimed in claim 3, wherein the closed loop controller includes a placement machine shut-down instruction in the control signal when an alarm condition is met.

7. The method as claimed in claim 1, wherein the closed loop controller also uses an identifier of a substrate to generate the control signal.

8. The method as claimed in claim 1, wherein said production data associates placement machine parts at machine, beam, turret, head, nozzle, and feeder levels with deposited components.

9. The method as claimed in claim 1, wherein the closed loop controller dynamically generates an output to convey the measurement data to a process engineer.

10. The method as claimed in claim 9, wherein said output comprises accuracy charts graphically illustrating accuracy of a deposited item.

11. The method as claimed in claim 9, wherein the closed loop controller starts feeding back the control signal after generating said output and receiving an instruction from a process engineer.

12. The method as claimed in claim 1, wherein both the placement machine and the measurement machine automatically detect a substrate identifier, and the measurement machine incorporates said identifier in the measurement data, for correlating the production data with the measurement data.

13. The method as claimed in claim 12, wherein the substrate identifier is a bar code and the placement machine and the measurement machine read said bar code.

14. The method as claimed in claim 1, wherein the closed loop controller comprises a measurement server and a closed loop client, the measurement server captures measurement data from the measurement machine, and the closed loop client captures the data from the placement machine, generates the control signal and feeds it back to the placement machine.

15. The method as claimed in claim 14, wherein there is one measurement server associated with each measurement machine.

16. The method as claimed in claim 14, wherein there is one closed loop client associated with each placement machine.

17. The method as claimed in claim 14, wherein the closed loop client forwards the production data to the measurement server and the measurement server uses said measurement data and said production data to generate correlated data, and feeds the correlated data to the closed loop client.

18. The method as claimed in claim 17, wherein the closed loop client uses the correlated data to generate the control signal according to configuration rules associated with the an associated placement machine.

19. The method as claimed in claim 18, wherein the closed loop controller dynamically generates an output to convey the measurement data to a process engineer; and wherein the closed loop client generates the process engineer output according to correlated data received from the measurement server.

20. The method as claimed in claim 14, wherein the measurement server comprises a data processing server, the closed loop client comprises a data processing client, and the client and the server communicate with each other using the client/server architecture.

21. A closed loop controller comprising:

means for automatically capturing measurement data from a measurement machine for inspecting a circuit having components deposited by a placement machine; and means for dynamically receiving feed-forward production data from the placement machine in real time, said production data associating parts of the placement machine with deposited components;

means for using said measurement data and said production data to generate a control signal for the placement machine, and for feeding said control signal back to the placement machine.

22. The controller as claimed in claim 21, wherein the closed loop controller comprises:

a measurement server including means for capturing said measurement data and for correlating the measurement data with said production data indicating which parts of the production machine were involved in depositing items, and for feeding back correlated data, and a closed loop client including means for receiving the fed back correlated data and for using said correlated data to generate the control signal according to configuration rules.

23. The controller as claimed in claim 22, where the closed loop client comprises means for generating said output using the correlated data.

24. The controller as claimed in claim 23, wherein the closed loop client comprises means for initiating feedback of a control signal upon receipt of a process engineer instruction.

25. The controller as claimed in claim 22, wherein the measurement server comprises a data processing server, the closed loop client comprises a data processing client, and the client and the server comprise means for communicating with each other using the client/server architecture.

26. The controller as claimed in claim 21, wherein the closed loop controller comprises means for generating a process engineer output incorporating said measurement data.

27. A method of producing a circuit in which a placement machine deposits components onto a substrate and a measurement machine inspects for quality, the method comprising the further steps of:
- a closed loop controller capturing measurement data from said measurement machine;
- the closed loop controller dynamically receiving feed forward production data from the placement machine in real time, said production data associating parts of the placement machine with deposited components;
- the closed loop controller further using said measurement data and said production data to generate a control signal for the placement machine;
- the placement machine using said control signal for improved process control;
- the closed loop controller generating displays to convey to a process engineer the measurement data for a particular placement machine part for a plurality of components placed by that placement machine part; and
- the closed loop controller starts feeding back the control data after generating said displays and receiving an instruction from a process engineer.

28. The method as claimed in claim 27, wherein said placement machine part is a turret, a head, or a nozzle.

29. A closed loop controller comprising:
- means for automatically capturing measurement data from a measurement machine for inspecting a circuit having components deposited by a placement machine; and
- means for dynamically receiving feed-forward production data from the placement machine in real time, said production data associating parts of the placement machine with deposited components;
- means for using said measurement data and said production data to generate a control signal for the placement machine, and for feeding said control signal back to the placement machine;
- the closed loop controller comprises means for generating displays to convey to a process engineer the measurement data for a particular placement machine part for a plurality of components placed by that placement machine part; and
- the closed loop controller comprises means for starting to feed back the control signal after generating said displays and receiving an instruction from a process engineer.

30. The closed loop controller as claimed in claim 29, wherein said placement machine part is a turret, a head, or a nozzle.

* * * * *